United States Patent
Tsirkin et al.

(10) Patent No.: US 11,429,416 B2
(45) Date of Patent: *Aug. 30, 2022

(54) MEMORY DEDUPLICATION BASED ON GUEST PAGE HINTS

(71) Applicant: Red Hat Israel, Ltd., Ra'anana (IL)

(72) Inventors: Michael Tsirkin, Westford, MA (US); Uri Lublin, Ra'anana (IL)

(73) Assignee: RED HAT ISRAEL, LTD., Ra'anana (IL)

( * ) Notice: Subject to any disclaimer, the term of this patent is extended or adjusted under 35 U.S.C. 154(b) by 0 days.

This patent is subject to a terminal disclaimer.

(21) Appl. No.: 16/383,899

(22) Filed: Apr. 15, 2019

(65) Prior Publication Data

US 2019/0243677 A1 Aug. 8, 2019

Related U.S. Application Data

(63) Continuation of application No. 15/251,943, filed on Aug. 30, 2016, now Pat. No. 10,261,820.

(51) Int. Cl.
*G06F 9/455* (2018.01)
*G06F 11/14* (2006.01)
*H03M 7/30* (2006.01)

(52) U.S. Cl.
CPC ...... *G06F 9/45558* (2013.01); *G06F 11/1453* (2013.01); *H03M 7/30* (2013.01); *H03M 7/3091* (2013.01); *G06F 2009/45583* (2013.01)

(58) Field of Classification Search
None
See application file for complete search history.

(56) References Cited

U.S. PATENT DOCUMENTS

| | | | |
|---|---|---|---|
| 6,789,156 B1 | 9/2004 | Waldspurger | |
| 7,500,048 B1 | 3/2009 | Venkitachalam | |
| 7,567,188 B1 | 7/2009 | Anglin et al. | |
| 7,620,766 B1 * | 11/2009 | Waldspurger | ....... G06F 12/1018 711/6 |
| 8,412,848 B2 | 4/2013 | Therrien et al. | |
| 8,423,519 B2 | 4/2013 | Tofano | |
| 8,909,845 B1 | 12/2014 | Sobel et al. | |

(Continued)

OTHER PUBLICATIONS

Fabian Franz, "Using I/O-Based Hints to Make Memory-Deduplication Scanners More Efficient", Jul. 29, 2012, Department of Computer Science, Karlsruhe Institute for Technologies, https://os.itec.kit.edu/downloads/da_2012_franz-fabian_memory-deduplication-scanners.pdf.

(Continued)

*Primary Examiner* — Charles Rones
*Assistant Examiner* — Jonah C Krieger
(74) *Attorney, Agent, or Firm* — Haynes and Boone, LLP

(57) ABSTRACT

Methods, systems, and computer program products are included for de-duplicating one or more memory pages. A method includes receiving, by a hypervisor, a list of read-only memory page hints from a guest running on a virtual machine. The list of read-only memory page hints specifies a first memory page marked as writeable. The method also includes determining whether the first memory page matches a second memory page. In response to a determination that the first memory page matches the second memory page, the hypervisor may deduplicate the first and second memory pages.

19 Claims, 7 Drawing Sheets

(56) References Cited

U.S. PATENT DOCUMENTS

| | | |
|---|---|---|
| 8,935,506 B1 | 1/2015 | Gopalan |
| 9,053,053 B2 | 6/2015 | Bacher et al. |
| 2010/0088474 A1* | 4/2010 | Agesen ............... G06F 9/45537 711/147 |
| 2011/0320681 A1 | 12/2011 | Borntraeger |
| 2012/0017028 A1 | 1/2012 | Tsirkin |
| 2012/0246436 A1 | 9/2012 | Wang |
| 2013/0159639 A1 | 6/2013 | Corrie |
| 2014/0331017 A1 | 11/2014 | Dawson et al. |
| 2015/0052323 A1 | 2/2015 | Noel et al. |
| 2015/0213049 A1 | 7/2015 | Kleiman et al. |
| 2015/0248237 A1 | 9/2015 | Tsirkin |
| 2016/0179370 A1* | 6/2016 | Kumar ................ G06F 11/1076 714/770 |
| 2017/0147224 A1* | 5/2017 | Kumar ................ G06F 11/1453 |
| 2017/0357592 A1* | 12/2017 | Tarasuk-Levin .... G06F 9/45558 |
| 2018/0136971 A1* | 5/2018 | Dong ................... G06F 9/4856 |

OTHER PUBLICATIONS

Jui-Hao Chiang, Han-Lin Li, Tzi-Cker Chiueh, "Introspection-Based Memory De-Duplication and Migration", Mar. 16-17, 2013, Stony Brook University, Stony Brook, USA; Industrial Technology Research Institute, Hsinchu, Taiwan. https://labs.vmware.com/vee2013/docs/p51.pd.

Konrad Miller, Fabian Franz, Marc Rittinghaus, Marius Hillenbrand, Frank Bellosa, "XLH: More Effective Memory Deduplication Scanners Through Cross-Layer Hints", 2013, Karlsruhe Institute of Technology (KIT), https://www.usenix.org/system/files/conference/atc13/atc13-miller.pdf.

* cited by examiner

MEMORY DEDUPLICATION BASED ON GUEST PAGE HINTS

RELATED APPLICATIONS

This application is a continuation of U.S. patent application Ser. No. 15/251,943, filed Aug. 30, 2016, and entitled "Memory Deduplication Based On Guest Page Hints", the disclosure of which is hereby incorporated by reference in its entirety.

FIELD OF DISCLOSURE

The present disclosure generally relates to electrical computers and digital data processing, and more particularly to memory management.

BACKGROUND

A virtual machine is software that is executed on hardware to create a virtualization of a physical computer system. Virtual machines may function as self-contained platforms that run their own operating systems and software applications. A host machine may concurrently run one or more virtual machines using a hypervisor. The hypervisor allocates a certain amount of the host machine's resources, such as the host machine's underlying physical processors and memory devices, to each of the virtual machines. This allocation by the hypervisor allows guests of the virtual machines to transparently access the host machine's resources. Guest applications, including guest operating systems, may be executed on the allocated resources of each virtual machine. Local or remote clients may access these guest applications to perform computing tasks. In some instances, virtual machines and guest applications may be implemented to provide cloud computing environments.

Memory of a host machine and virtual machines running on the host machine is typically divided into memory pages. In some host machines, the hypervisor reduces physical memory consumption by using memory deduplication techniques to reduce the amount of memory pages that store the same data. Memory deduplication improves memory utilization by detecting that two (or more) pages in memory are identical and merging the duplicate pair of pages into a single page. In an example, a first memory page may reside in a first virtual machine's memory space, and a second memory page may reside in a second virtual machine's memory space. If the first and second memory pages have the same content, the first memory page may be considered a duplicate of the second memory page and removed. In such an example, a page table entry of the first virtual machine may be modified to point to the second memory page, and the first virtual machine may use the second memory page rather than the first memory page, thus improving the utilization of memory.

Memory deduplication may be performed by the hypervisor scanning memory pages assigned to virtual machines to identify memory pages that store the same content. The hypervisor consolidates memory pages that store the same content into a single memory page, thereby reducing the amount of memory resources used by the virtual machines.

BRIEF SUMMARY

Methods, system, and techniques for de-duplicating one or more memory pages are provided.

An example method of de-duplicating one or more memory pages includes receiving, by a hypervisor, a list of read-only memory page hints from a guest running on a virtual machine. The list of read-only memory page hints specifies a first memory page marked as writeable. The method also includes determining whether the first memory page matches a second memory page. The method further includes in response to a determination that the first memory page matches the second memory page, deduplicating, by the hypervisor, the first and second memory pages.

An example system for de-duplicating one or more memory pages includes a deduplication module that obtains a list of read-only memory page hints and determines whether a first memory page specified in the list matches a second memory page. The list of read-only memory page hints includes a first memory page marked as writeable. In response to a determination that the first memory page matches the second memory page, the deduplication module deduplicates the first and second memory pages. The system also includes a hypervisor memory that stores a data structure including the second memory page.

An example machine-readable medium includes a plurality of machine-readable instructions that when executed by one or more processors is adapted to cause the one or more processors to perform a method including: receiving, by a hypervisor, a list of read-only memory page hints from a guest running on a virtual machine, the list of read-only memory page hints including a first memory page marked as writeable; determining whether the first memory page matches a second memory page; and in response to a determination that the first memory page matches the second memory page, deduplicating, by the hypervisor, the first and second memory pages.

Figure 1:
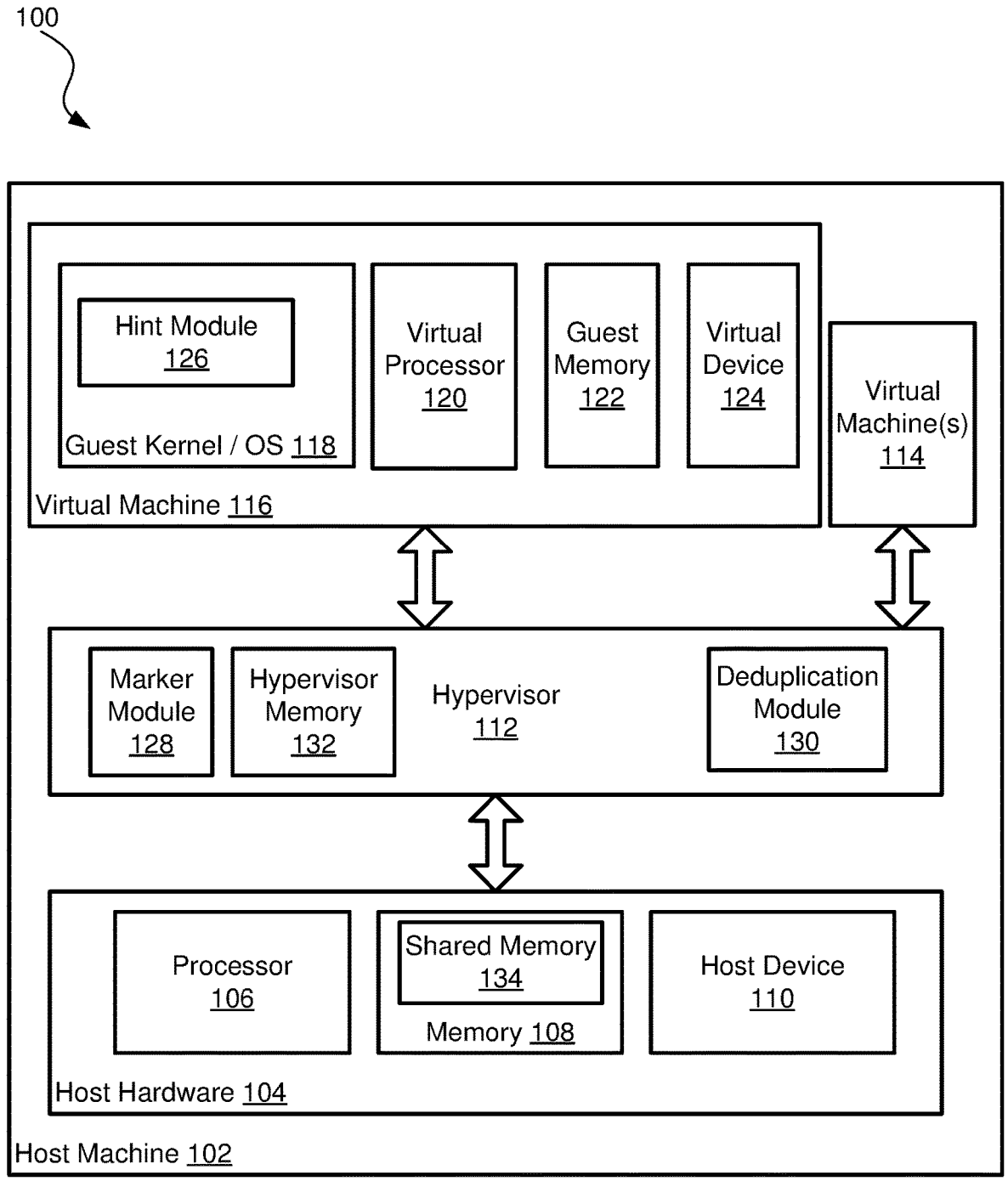
FIG. 1 is a block diagram illustrating a virtualized computing system that performs memory deduplication, in accordance with various examples of the present disclosure.

Examples of the present disclosure and their advantages are best understood by referring to the detailed description that follows.

DETAILED DESCRIPTION

In the following description, specific details are set forth describing some examples consistent with the present disclosure. It will be apparent, however, to one skilled in the art that some examples may be practiced without some or all of these specific details. The specific examples disclosed herein are meant to be illustrative but not limiting. One skilled in the art may realize other elements that, although not specifically described here, are within the scope and the spirit of this disclosure. In addition, to avoid unnecessary repetition, one or more features shown and described in association with one example may be incorporated into other examples unless specifically described otherwise or if the one or more features would make an example non-functional.

Memory deduplication improves memory utilization by detecting that two (or more) pages in memory have identical content. In some examples, memory deduplication analyzes patterns of information by segmenting a dataset into, for example, variable length blocks and searching for recurring blocks. All identical successive blocks are replaced with a pointer to the respective initial detected block instead of storing the block again. When reading the file, the pointer series ensures that all the blocks are accessed in the exact order.

In some examples, a hypervisor may process memory pages, insert them into a data structure, and identify memory pages in the data structure that are identical. Two memory pages are identical if the content stored at those pages is the same. If two memory pages are identified as being identical, the hypervisor may identify the virtual machines that use those particular memory pages and map the two virtual machines to reference one of those identical memory pages and discard the other memory page. The page table entries of the first and second virtual machines that point to the second memory page may be marked as write-protected to trigger a page fault and a copy-on-write. Accordingly, both the first virtual machine's page table and the second virtual machine's page table may store a mapping to the same memory page, which may be referred to as a deduplicated memory page. The hypervisor marks the deduplicated memory page as copy-on-write. If the first virtual machine attempts to modify the deduplicated memory page, the hypervisor provides the first virtual machine with a copy of the deduplicated memory page and updates the mapping in the first virtual machine's page table to reference the copy of the deduplicated memory page (rather than to the original deduplicated memory page). The first virtual machine may then be allowed to write to the copy of the deduplicated memory page.

Although memory deduplication may have its advantages, it may also have disadvantages. For example, the hypervisor typically write protects memory pages and scans these memory pages for duplicates. The hypervisor may write protect a memory page by marking it as non-modifiable. If the first virtual machine attempts to write to one of these deduplicated memory pages, the write triggers a page fault and an exit to the hypervisor. The page fault and exit to the hypervisor may be time consuming and cause the system to slow down. Additionally, write protecting memory pages is expensive, especially if the hypervisor write-protects memory before it starts looking for duplicates. Additionally, scanning large ranges of memory for duplicates may be expensive as well.

The present disclosure may provide benefits that overcome these disadvantages. Virtual machine guests may identify to the hypervisor particular memory pages that it does not plan to modify within a particular time period. Virtual machine guests may identify these memory pages to the hypervisor, via a memory region shared between the hypervisor and the guest, such that the hypervisor may scan and target these memory pages for deduplication. For example, rather than comparing all of a virtual machine's memory with another virtual machine's memory to detect which memory pages to deduplicate, the guest may provide a list of read-only memory page hints to the hypervisor. The list of read-only memory page hints includes memory pages that the guest will not modify for a period of time. The hypervisor may compare the memory pages specified in the list of read-only memory page hints from one or more guests, with all or a portion of the memory pages from other virtual machines, thus reducing the number of memory pages that are compared. This technique may reduce processing costs associated with write-protecting memory pages and the page fault and subsequent exit to the hypervisor when a virtual machine attempts to write to the write-protected memory page, and thereby may also provide improved speeds.

These techniques are beneficial and advantageous for improving processing efficiency and performance while at the same time improving memory usage. Of course, it is understood that these features and advantages are shared among the various examples herein and that no one feature or advantage is required for any particular example.

FIG. 1 is a block diagram illustrating a virtualized computing system 100 that performs memory deduplication, in accordance with various examples of the present disclosure. The system 100 includes a host machine 102. The host machine 102 may include a personal computer (PC), tablet PC, rack mount computer, cellular telephone, web appliance, server, network router, switch or bridge, or any machine capable of executing a set of instructions (sequential or otherwise) that specify actions to be taken by that machine. Further, while a single host machine is illustrated, the term "machine" shall also be taken to include any collection of machines that individually or jointly execute a set (or multiple sets) of instructions to perform any one or more of the methodologies discussed herein. For example, a collection of machines may be communicatively coupled via one or more network devices and/or transport media.

The host machine 102 includes host hardware 104. Host hardware 104 includes physical elements such as a processor 106, a memory 108, and a host device 110. While one of each of these elements is illustrated for the purposes of simplicity, in some examples more than one or more of these hardware elements may be included. For example, the host hardware 104 may include a plurality of processors as well as various types of memory and host devices.

A "processor" may also be referred to as a "physical processor" or "central processing unit (CPU)" herein. A processor shall refer to a device capable of executing instructions encoding arithmetic, logical, or input/output (I/O) operations. In one illustrative example, a processor may follow the Von Neumann architectural model and may include an arithmetic logic unit (ALU), a control unit, and a plurality of registers. In a further aspect, a processor may be a single core processor that is typically capable of executing one instruction at a time (or process a single pipeline of instructions), or a multi-core processor that may simultaneously execute multiple instructions. In another aspect, a processor may be implemented as a single integrated circuit, two or more integrated circuits, or may be a component of a multi-chip module (e.g., in which individual microprocessor dies are included in a single integrated circuit package and hence share a single socket).

In the present example, the processor 106 is structured to include one or more general-purpose processing devices such as a microprocessor, central processing unit, and the like. More particularly, the processor 106 may include a complex instruction set computing (CISC) microprocessor, reduced instruction set computing (RISC) microprocessor, very long instruction word (VLIW) microprocessor, or a processor implementing other instruction sets or processors implementing a combination of instruction sets. In some examples, the processor 106 is structured to include one or more special-purpose processing devices such as an application specific integrated circuit (ASIC), a field programmable gate array (FPGA), a digital signal processor (DSP), network processor, and so forth. The processor 106 executes instructions for performing the operations, steps, and actions discussed herein.

"Memory" herein shall refer to volatile or non-volatile memory, such as random access memory (RAM), read-only memory (ROM), electrically erasable ROM (EEPROM), or any other memory capable of storing data. In the present example, the memory 108 is structured to include at least one computer-readable storage medium on which is stored one or more sets of instructions (e.g., software) embodying any one or more of the methodologies or functions described herein. The memory 108 may be structured to include one or more of a read-only memory (ROM), flash memory, dynamic random access memory (DRAM) such as synchronous DRAM (SDRAM), double data rate (DDR SDRAM), or DRAM (RDRAM), and so forth), static memory (e.g., flash memory, static random access memory (SRAM), and so forth), and a data storage device (e.g., a hard disk drive (HDD), solid state drive (SSD), and so forth). Accordingly, any of the operations, steps, and actions of the methods described herein may be implemented using corresponding machine-readable instructions stored on or in a non-transitory computer-readable medium that are executable by the processor 106.

In the present example, the host device 110 is structured to include at least one hardware device, such as a network interface card, wireless adapter card, audio/sound card, graphics card, storage adapter, or other hardware device. In some examples, these hardware devices are coupled to a PCI bus provided by the host hardware 104. In other examples, hardware devices are integrated into a motherboard provided by the host hardware 104. The processor 106, memory 108, and host device 110 hardware elements of the host hardware 104 may be communicatively coupled via one or more buses. The host hardware 104 also may include other hardware elements, such as a video display unit (e.g., a liquid crystal display (LCD) monitor), alphanumeric input device (e.g., a keyboard), cursor control device (e.g., a mouse), signal generation device (e.g., a speaker), and so forth.

The host machine 102 includes a hypervisor 112, which also may be referred to as a virtual machine monitor, virtual machine manager, and/or VMM. The hypervisor 112 may include executable instructions that are stored in the memory 108 and executed by the processor 106 to provide one or more virtual machines (e.g., virtual machine 116 and one or more other virtual machines 114, which may be structured similarly to virtual machine 116).

In some examples, the hypervisor 112 is run on top of a host operating system and host kernel. In other examples, the hypervisor 112 is run directly on host hardware 104 without the use of a host operating system. The hypervisor 112 may also be structured to use or include functions provided by a host operating system and/or host kernel. For example, the kernel may provide kernel modules, such as Kernel Same-Page Merging (KSM), that include functions for scanning memory and merging duplicate memory pages. The hypervisor 112 may use such functions to manage virtual machines, resources provided to virtual machines, and otherwise control operations corresponding to virtual machines. Accordingly, these functions may be considered to be part of the hypervisor. In other examples, functionality for performing deduplication may be included in the hypervisor while being stored in a memory space that is external to a host kernel and/or host operating system.

In the present example, hypervisor 112 is structured to include instructions that are executed to provide one or more virtual machines 114 and a virtual machine 116. The virtual machine(s) 114 may include components similar to those illustrated with respect to virtual machine 116, such as a kernel, operating system, virtual processor, guest memory, virtual device, and so forth.

The hypervisor 112 is structured to provide the virtual machine 116 by virtualizing at least a portion of the host hardware 104. The hypervisor 112 may provide the virtual machine 116 by performing a hardware emulation, full virtualization, para-virtualization, and/or operating system-level virtualization corresponding to the host machine 102. In some examples, hypervisor 112 is structured to rely upon, use, or include features provided by a kernel and/or operating system running on the host machine 102. In these examples, the hypervisor 112 may call one or more memory deduplication functions that are provided by a host machine 102 kernel that runs underneath the hypervisor 112. Accordingly, the hypervisor 112 is structured to provide the memory deduplication features.

The hypervisor 112 manages system resources, including providing access of guests (e.g., guest applications such as operating systems, kernels, user applications, and so forth) of the virtual machine 116 to the host hardware 104, such as the processor 106, the memory 108, and the host device 110. In the present example, the system resources that are provided to the guests of the virtual machine 116 include a virtual processor 120 that is mapped to the processor 106, the guest memory 122 that is mapped to at least a portion of the memory 108, and a virtual device 124 that corresponds to the host device 110.

The hypervisor 112 is structured to receive a list of read-only memory page hints from one or more guests of the virtual machines (e.g., virtual machine 116) corresponding to modifying of memory pages that are included in the guest memories (e.g., guest memory 122). The list of read-only memory page hints may be stored in a memory region shared between the hypervisor 112 and the one or more guests. Based on the received list of read-only memory page hints, the hypervisor 112 is structured to trigger memory deduplication techniques, such as scanning the memory 108 to identify memory pages that store identical data, merging the identified memory pages, referencing the merged memory pages by multiple virtual machines, marking each merged memory page copy-on-write (COW), and in the event that merged memory pages are modified, creating separate copies of the merged memory pages to store any modifications.

In the present example, the virtual machine 116 includes a guest kernel/operating system (OS) 118. The guest kernel/operating system 118 may be structured to include a kernel as well as an operating system that runs on top of the kernel. However, in other examples, the guest kernel/operating system 118 may include a stand-alone kernel that does not have an operating system running on top of the kernel.

The kernel of the virtual machine 116 provides core computing functionality to the virtual machine 116. For example, a kernel manages important tasks of the virtual machine 116, such as allocating memory pages of the guest memory 122 to virtual machine processes and/or threads, communicating I/O to and from the virtual device 124, managing a file system, handling interrupts, scheduling and running processes to execute instructions of computing tasks by the virtual processor 120, providing an interface between devices and software applications, and/or providing other important computing features.

A guest operating system of the virtual machine 116 may run on top of the kernel to provide additional interfaces and functionality on the virtual machine 116 beyond those offered by the kernel. The guest operating system may include, for example, RED HAT ENTERPRISE LINUX, FEDORA, WINDOWS, OS X, IOS, ANDROID, or other operating system. In some examples, the virtual machine 116 may be structured to include a plurality of guest operating systems that run on top of the kernel.

In the present example, the virtual processor 120 includes one or more processors that may be accessed by processes running on the virtual machine 116 to pass instructions to the processor 106 for execution. These instructions may include executable instructions stored on memory pages in the guest memory 122. For example, executable instructions may correspond to instructions of executable (binary) files and/or libraries that are executed to perform actions on the virtual machine 116.

The hypervisor 112 allocates the guest memory 122 to the virtual machine 116. In the present example, the guest memory 122 includes a portion of the memory 108. The guest memory 122 may include one or more ranges of memory pages that are mapped to the memory 108, such that processes running on the virtual machine 116 may access the memory 108 by accessing the guest memory 122. These ranges of memory pages may include one or more consecutive and/or non-consecutive memory ranges. Each range may include one or more memory pages. The mapping between the memory pages of the guest memory 122 and the memory pages of the memory 108 may be provided by one or more page tables of the hypervisor 112 and/or virtual machine 116.

In the present example, the virtual device 124 is a virtual representation of the host device 110. The hypervisor 112 may expose the host device 110 to the virtual machine 116 to allow the virtual machine 116 to create the virtual device 124 that corresponds to the host device 110. Accordingly, the hypervisor 112 and virtual machine 116 may create a virtual device 124 that represents the host device 110. The virtual device 124 may be accessed by the virtual machine 116 and/or guest kernel/operating system 118 to perform 110 operations with respect to the host device 110.

In the present example, the guest kernel/operating system 118 includes a hint module 126. In some examples, the hint module 126 is provided by a guest operating system. The hint module 126 is structured to determine which memory pages the guest kernel/operating system 118 will modify and/or also which memory pages the guest kernel/operating system 118 will not modify for a particular period of time. The hint module 126 provides a list of read-only memory page hints to the hypervisor 112. The list of read-only memory page hints specifies one or more memory pages that the guest kernel/operating system 118 will not modify for a period of time. The list of read-only memory page hints may be thought of as an "optimization guidance" supplied by the guest kernel/operating system 118 to the hypervisor 112, where the guest kernel/operating system 118 suggests that it will not modify those memory pages listed in the list of read-only memory page hints for a period of time. Accordingly, until the period of time elapses, the hypervisor 112 assumes that the memory pages listed in the list of read-only memory page hints will not be modified by the guest kernel/operating system 118. It may be advantageous to compare a memory page that is assumed to not be modified for a threshold period of time and deduplicate this memory page, if appropriate, because it saves time and processing cycles. For example, it may be a waste of time and processing cycles to deduplicate a memory page if it will be modified soon by the guest kernel/operating system 118.

In some examples, the memory pages specified in the list of read-only memory page hints are marked as writeable in the guest page table. In some examples, the memory pages specified in the list of read-only memory page hints are marked as write-protected in the guest page table. It should be understood that the memory pages included in the list of read-only memory pages are read-only in the sense that the guest will not modify them in the near future (e.g., within a threshold amount of time). This may or may not reflect the memory pages' actual permissions in the guest page tables. In an example, memory page permissions may be mapped read-only in all applications, or not mapped in any applications, or mapped read-only in the guest kernel, or mapped writeable in applications or in the guest page tables.

In the present disclosure, a memory page that is described as writeable or write-protected, or marked as writeable or write-protected, is indicated or marked as such in the hypervisor page tables. At the same time, these memory pages can either be writeable or write-protected in the guest page tables. Accordingly, the hypervisor pages tables and guest page tables may indicate different memory permissions for the same memory pages.

The hypervisor 112 may compare the memory pages specified in the list of read-only memory page hints, without write-protecting those memory pages. While the deduplication module 130 scans the memory pages listed in the list of read-only memory page hints and compares them to other memory pages to look for duplicates, however, the guest kernel/operating system 118 may modify at least one of these memory pages. The hypervisor 112 includes a hypervisor memory 132, marker module 128, and deduplication module 130. The marker module 128 and the deduplication module 130 may be structured to communicate with each other and the guest kernel/operating system 118 to deduplicate the appropriate memory pages. The deduplication module 130 analyzes the memory pages listed in the list of read-only memory page hints and deduplicates the appropriate memory pages. The marker module 128 marks memory pages as writable, readable, and/or executable. In an example, the marker module write protects a memory page by indicating that the memory page is read-only or readable-and-executable only.

Figure 2:
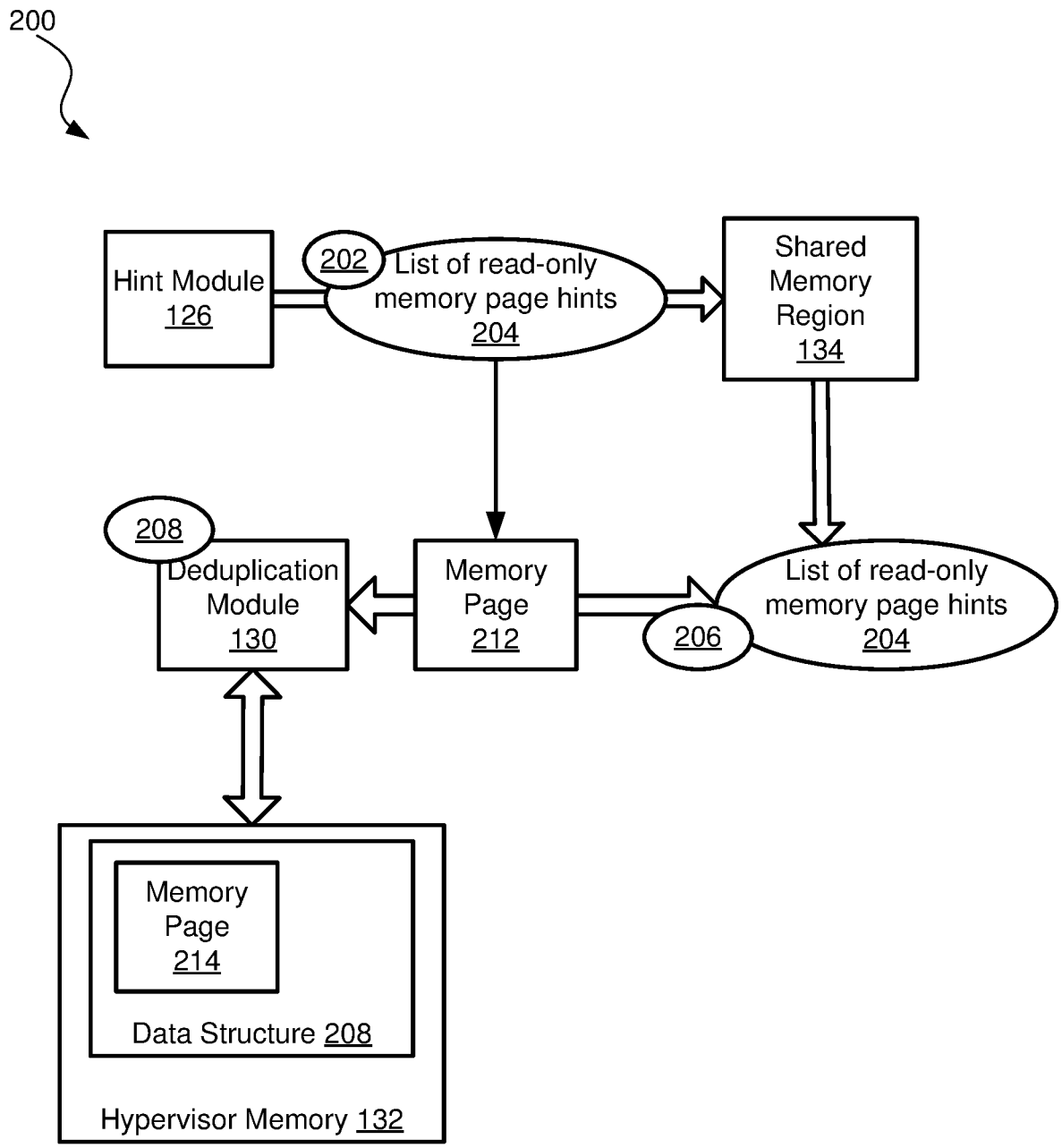
FIG. 2 is a diagram illustrating a process flow for initiating memory page deduplication, in accordance with various examples of the present disclosure.

FIG. 2 is a diagram illustrating a process flow 200 for initiating memory page deduplication, in accordance with various examples of the present disclosure.

At action 202, the hint module 126 sends a list of read-only memory page hints 204 to the hypervisor 112. The memory pages included in the list of read-only memory page hints 204 may be marked as writeable or write-protected in the guest page tables. The hint module 126 may send the list of read-only memory page hints 204 to the hypervisor 112 by storing the list in the shared memory region 134, and the deduplication module 130 may access the list by reading it from the memory region 134. The hypervisor 112 assumes that the memory pages listed in the list of read-only memory page hints 204 will not be modified by the guest kernel/operating system 118 for an agreed upon period of time.

In an example, the list of read-only memory page hints 204 is implemented using a bitmap. In an example, the hint module 126 sets a bit in the bitmap to indicate that the bit corresponding to a memory page is mapped writable into an application or is allocated for internal kernel use, and the hint module 126 clears a bit in the bitmap to indicate that the bit corresponding to a memory page will not be modified for a period of time. In another example, the hint module 126 clears a bit in the bitmap to indicate that the bit corresponding to a memory page is mapped writable into an application or is allocated for internal kernel use, and the hint module 126 sets a bit in the bitmap to indicate that the bit corresponding to a memory page will not be modified for a period of time. Although the list of read-only memory page hints 204 is described as being implemented using a bitmap, it should be understood that this is not intended to be limiting and the list of read-only memory page hints 204 may be implemented using any data structure as long as both the guest kernel/operating system 118 and the hypervisor 112 understand the format. In another example, the list of read-only memory page hints 204 is implemented using a linked list. An entry in the linked list may correspond to a memory page that will not be modified by the guest kernel/operating system 118 for a period of time, and the entry may point to the next memory page that will not be modified by the guest kernel/operating system 118 for a period of time, and so on.

The deduplication module 130 may scan the shared memory region 134 periodically. Rather than track page writes, the hypervisor 112 may scan the list of read-only memory page hints 204 looking for duplicates stored in the data structure 208 and insert zero or more of the memory pages specified in the list into the data structure 208. The data structure 208 may be stored in the hypervisor memory 132 and store memory pages. The deduplication module 130 may receive a list of read-only memory page hints from multiple guests and determine whether to insert the memory pages specified in these lists of read-only memory page hints into the data structure 208. If the data structure 208 is empty, the deduplication module 130 may insert all of the pages listed in the list of read-only memory page hints 204 into the data structure 208. The data structure 208 may store memory pages that have been indicated by a guest in a list of read-only memory page hints. Accordingly, the data structure 208 may also be thought of as a "stable" data structure that stores memory pages that will not be modified by a guest within a time period.

If the data structure 208 is not empty, the deduplication module 130 scans the memory pages listed in the list of read-only memory page hints 204, and compares the scanned memory pages to the memory pages stored in the data structure 208. If the data structure 208 is not empty, the deduplication module 130 may perform actions 206 and 208. At action 206, the deduplication module 130 identifies memory page 212 listed in the list of read-only memory page hints 204. At action 208, the deduplication module 130 compares the identified memory page 212 to the memory pages stored in the data structure 208. The deduplication module 130 may perform two comparison phases to ensure that the appropriate memory pages are deduplicated.

Figure 3:
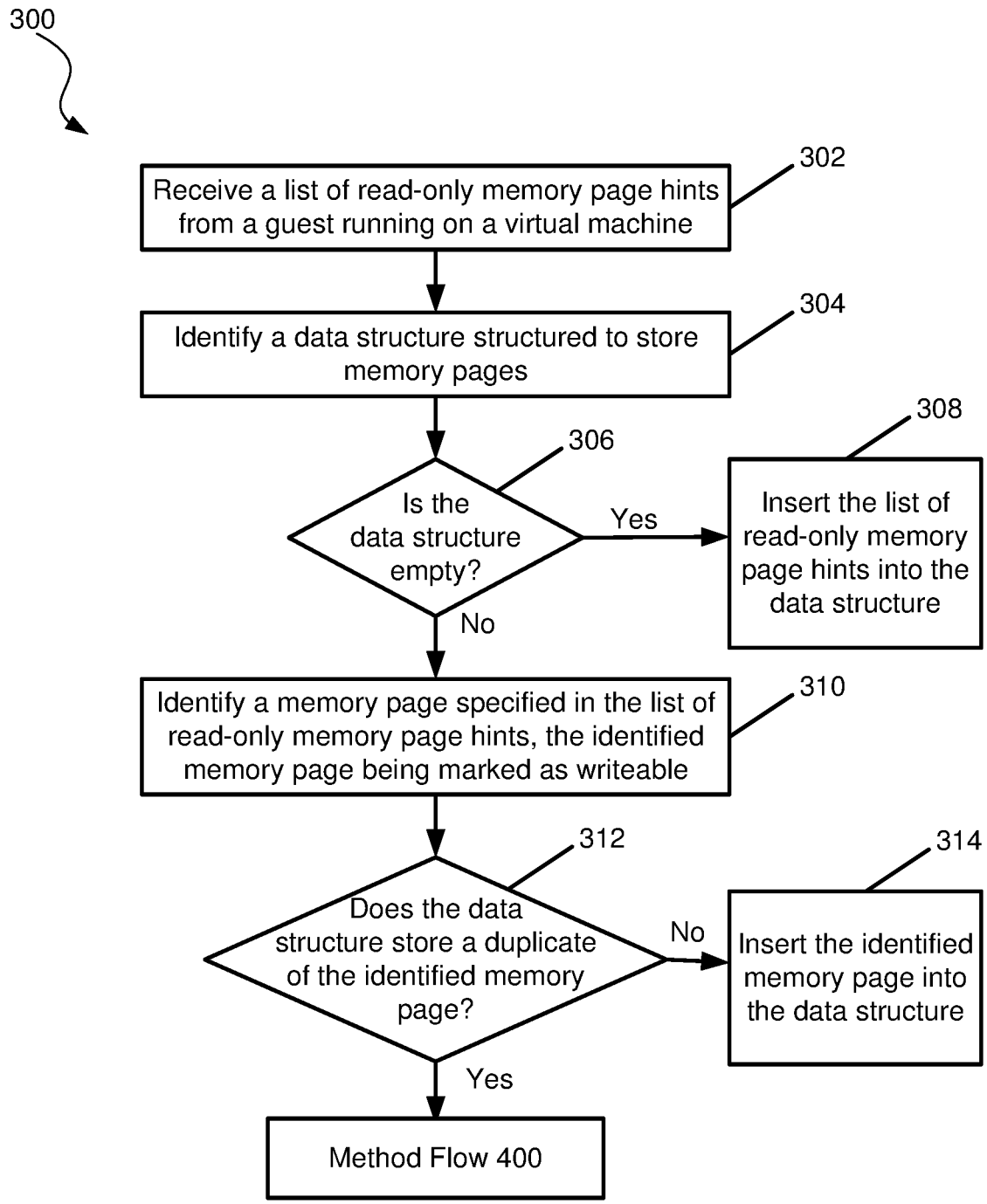
FIG. 3 is a diagram illustrating a method flow for initiating memory page deduplication, in accordance with various examples of the present disclosure.

FIG. 3 is a diagram illustrating a method flow 300 for initiating memory page deduplication, in accordance with various examples of the present disclosure. Method 300 is not meant to be limiting and may be used in other applications.

At action 302, the deduplication module 130 receives the list of read-only memory page hints 204 from the guest kernel/operating system 118 running on the virtual machine 116. The shared memory region 134 may be shared between the guest kernel/operating system 118 and the hypervisor 112. The hint module 126 included in the guest kernel/operating system 118 may store the list of read-only memory page hints 134 in the shared memory region 134, and the deduplication module 130 included in the hypervisor 112 may receive the list of read-only memory page hints 204 by reading it from the shared memory region 134.

At action 304, the deduplication module 130 identifies the data structure 208 structured to store memory pages. The memory pages may be guest memory pages that were included in previous list(s) of read-only memory page hints from guest(s). At action 306, the deduplication module 130 determines whether the data structure 208 is empty. If the data structure 208 is empty, the method flow 300 proceeds to action 308, in which the deduplication module 130 inserts the list of read-only memory page hints 204 into the data structure 208. The deduplication module 130 inserts the list of read-only memory page hints 204 into the data structure 208 because it does not store any memory pages that may be duplicates of memory pages specified in the list of read-only memory page hints 204.

If the data structure 208 is not empty, the method flow 300 proceeds to action 310, in which the deduplication module 130 identifies a memory page specified in the list of read-only memory page hints 204, the identified memory page being marked as writable. The deduplication module 130 analyzes this identified memory page, and may go on to analyze each of the memory pages listed in the list of read-only memory page hints 204. In an example, the identified memory page is memory page 212. At action 312, the deduplication module 130 determines whether the data structure 208 stores a duplicate of the identified memory page 212. If the data structure 208 does not store a duplicate of the identified memory page 212, the method flow 300 proceeds to action 314, in which the deduplication module 130 inserts the identified memory page 212 into the data structure 208. The deduplication module 130 may insert the memory page 212 into the data structure 208 because it does not store a duplicate of the memory page 212 and accordingly, it is unnecessary for the deduplication module 130 to deduplicate any memory pages based on this identified memory page 212. If the data structure 208 stores a duplicate of the identified memory page 212, the method flow 300 proceeds to a method flow 400 in FIG. 4.

It is understood that additional processes may be performed before, during, or after blocks 302-314 discussed above. It is also understood that one or more of the blocks of method 300 described herein may be omitted, combined, or performed in a different sequence as desired.

Figure 4:
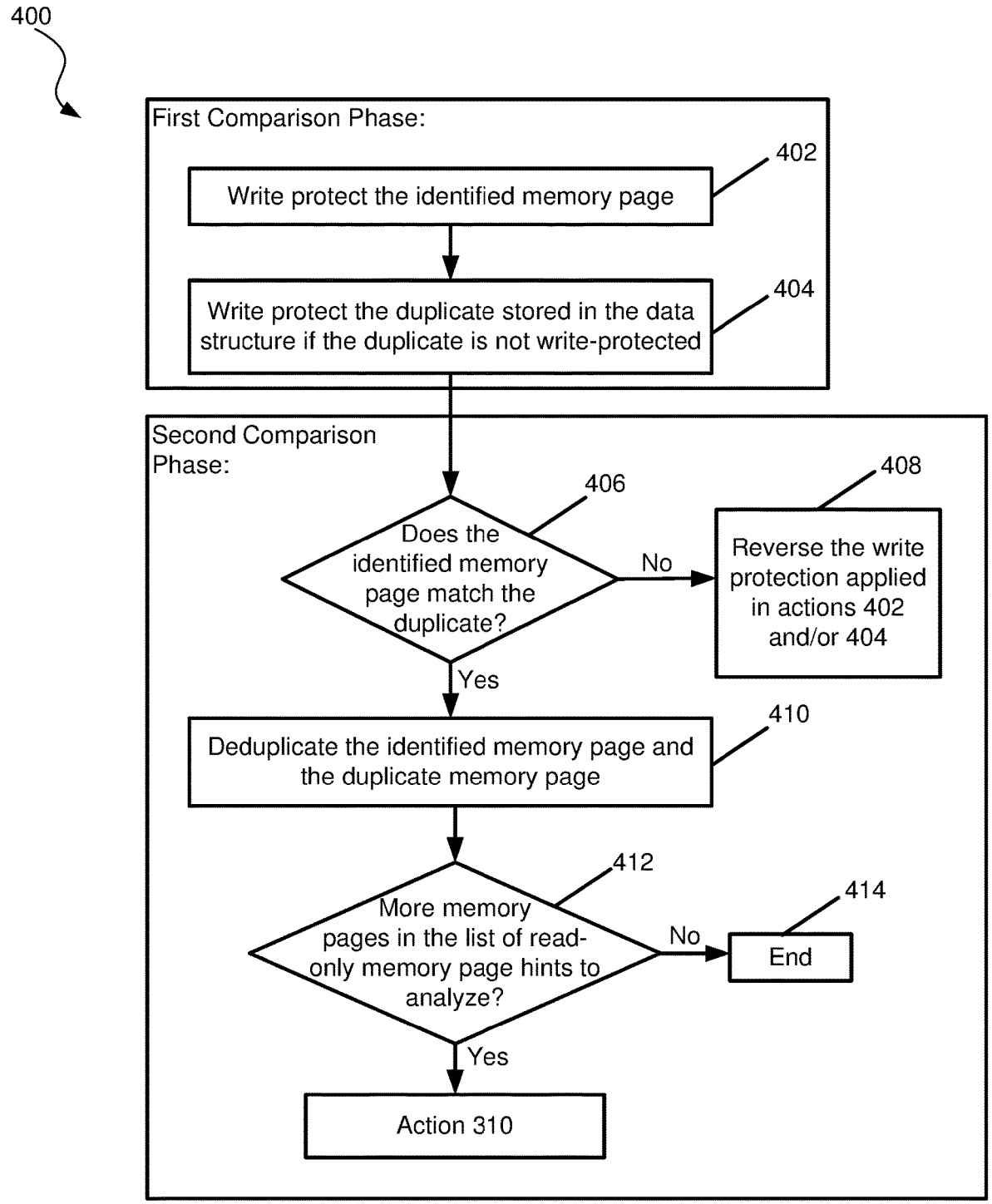
FIG. 4 is a diagram illustrating a method flow for initiating memory page deduplication, in accordance with various examples of the present disclosure.

FIG. 4 is a diagram illustrating a method flow 400 for initiating memory page deduplication, in accordance with various examples of the present disclosure. Method 400 is not meant to be limiting and may be used in other applications.

The memory pages specified in the list of read-only memory page hints 204 may be marked as writeable. Referring back to FIG. 2, the list of read-only memory page hints 204 specifies the memory page 212, and the data structure 208 includes a memory page 214. If the deduplication module 130 determines that the memory page 214 is a duplicate of the memory page 212 specified in the list of read-only memory page hints 204 and the deduplication module 130 starts to deduplicate these memory pages, one or both of these memory pages may be modified before they have been deduplicated, leading to data mistakenly being deleted from the system. Accordingly, the deduplication module 130 may perform two comparison phases to ensure that the appropriate memory pages are deduplicated.

Referring now to FIG. 3 and FIG. 4, a first comparison phase may include actions 312, 314, 402, and/or 404. For example, during the first comparison phase at action 312, the deduplication module 130 searches the data structure 208 for a duplicate of the memory page 212. A memory page is a duplicate of another memory page if they store the same content. If the data structure 208 stores a duplicate of the identified memory page 212, the method flow 300 proceeds to action 402, in which the deduplication module 130 write protects the identified memory page 212. At action 404, the deduplication module 130 write protects the duplicate memory page 214 stored in the data structure 208 if the duplicate is not write-protected. Accordingly, at the end of the first comparison phase, both the memory page 212 and its duplicate memory page 214 are write-protected, and not capable of being modified.

A second comparison phase may include actions 406, 408, 410, 412, and/or 414. At action 406, the deduplication module 130 determines whether the identified memory page 212 matches the duplicate memory page 214. If the deduplication module 130 determines that the identified memory page does not match the duplicate memory page, the method flow 400 proceeds to action 408, in which the deduplication module 130 reverses the write protection applied in action 402 and/or action 404. For example, if the deduplication module 130 applied write protection to the memory page 212 at action 402, the deduplication module 130 reverses this write protection at action 408. Similarly, if the deduplication module 130 applied write protection to the memory page 214 at action 404, the deduplication module 130 reverses this write protection at action 408.

In contrast, if the deduplication module 130 determines that the identified memory page 212 matches the duplicate memory page 214, the method flow 400 proceeds to action 410, in which the deduplication module 130 deduplicates the identified memory page 212 and the duplicate memory page 214. In an example, memory page 212 is allocated to the guest kernel/operating system 118, and a first set of page tables is the guest kernel/operating system 118's page table and references memory pages that are used by the guest kernel/operating system 118. The first set of page tables includes one or more page table entries, where a page table entry in the first set of page tables includes a mapping that references the memory page 212 in the guest kernel/operating system 118's address space. The deduplication module 130 may modify this mapping that references the memory page 212 to reference the memory page 214, which is a duplicate of the memory page 212.

Additionally, memory page 214 is allocated to a second guest kernel/operating system, and a second set of page tables is a second guest kernel/operating system's page table and references memory pages that are used by the second guest kernel/operating system. The second set of page tables includes one or more page table entries, where a page table entry in the second set of page tables includes a mapping that references the memory page 214 in the second guest kernel/operating system's address space. The deduplication module 130 may modify one of these mappings such that both the guest kernel/operating system 118's page table entry and the second guest kernel/operating system's page table entry reference the memory page 212 or reference the memory page 214. The memory page that is referenced by both entries may be referred to as the deduplicated memory page, and the memory page that is no longer referenced may be discarded and freed to store other data. Additionally, the deduplication module 130 may mark the deduplicated memory page as copy-on-write such that if the guest kernel/operating system 118 or the second guest kernel/operating system attempts to modify this deduplicated memory page, the hypervisor 112 copies the deduplicated memory page, updates the mapping of the guest's page table entry to reference the copy, and allows the appropriate guest to write to the copy.

At action 412, the deduplication module 130 determines whether the list of read-only memory page hints 204 includes any more memory pages to analyze. If the deduplication module 130 determines the list of read-only memory page hints 204 does not include more memory pages to analyze, the method flow 400 proceeds to action 414, in which the process flow ends. If the deduplication module 130 determines the list of read-only memory page hints 204 includes more memory pages to analyze, the method flow 400 proceeds to action 310 in method 300, in which another memory page specified in the list of read-only memory page hints 204 is identified.

It is understood that additional processes may be performed before, during, or after blocks 402-414 discussed above. It is also understood that one or more of the blocks of method 400 described herein may be omitted, combined, or performed in a different sequence as desired.

Figure 5:
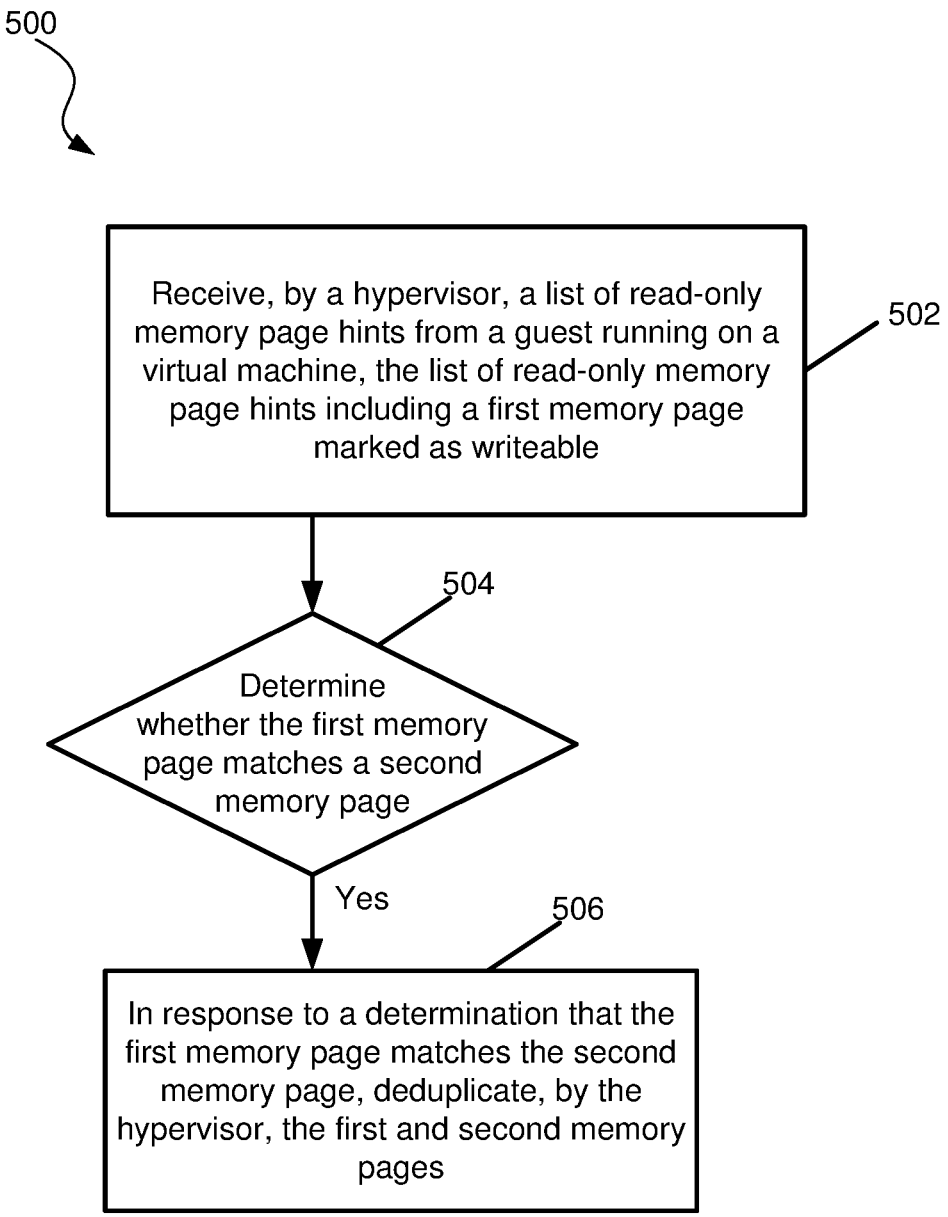
FIG. 5 is a diagram illustrating a method flow for initiating memory page deduplication, in accordance with various examples of the present disclosure.

FIG. 5 is a diagram illustrating a method flow 500 for initiating memory page deduplication, in accordance with various examples of the present disclosure. Method 500 is not meant to be limiting and may be used in other applications.

At action 502, the hypervisor 112 receives the list of read-only memory page hints 204 from the guest kernel/operating system 118 running on the virtual machine 116, the list of read-only memory page hints 204 specifying the memory page 212 marked as writeable. At action 504, the hypervisor 112 determines whether the memory page 212 matches a second memory page. If the memory page 212 matches the second memory page, the method flow 500 proceeds to action 506, in which the hypervisor 112 deduplicates the memory page 212 and the second memory page.

It is understood that additional processes may be performed before, during, or after blocks 502-508 discussed above. It is also understood that one or more of the blocks of method 500 described herein may be omitted, combined, or performed in a different sequence as desired.

In some examples, the list of read-only memory page hints 204 includes one or more time periods during which the guest kernel/operating system 118 will not modify one or more of the memory pages include in the list. In an example, the time period is the same for all memory pages listed in the list of read-only memory page hints 204. In this example, the deduplication module 130 may discard the list of read-only memory page hints 204 after the time period has elapsed. In another example, a plurality of memory pages listed in the list of read-only memory page hints 204 have different associated time periods, and the deduplication module 130 performs the first comparison phase for the memory page 212 before the time period elapses. For example, the deduplication module 130 may search the data structure 208 for a duplicate of the memory page 212 before the time period elapses. To avoid searching for a duplicate of the memory page 212 unnecessarily, the hint module 126 may calculate the time it may take to search the data structure 208 for a duplicate of the memory page 212. If the time period would have elapsed by the time it would take the deduplication module 130 to search the data structure 208 for a duplicate of the memory page 212, the deduplication module 130 may move onto the memory page after the memory page 212 listed in the list of read-only memory page hints 204 and search the data structure 208 for a duplicate of this next memory page.

Figure 6:
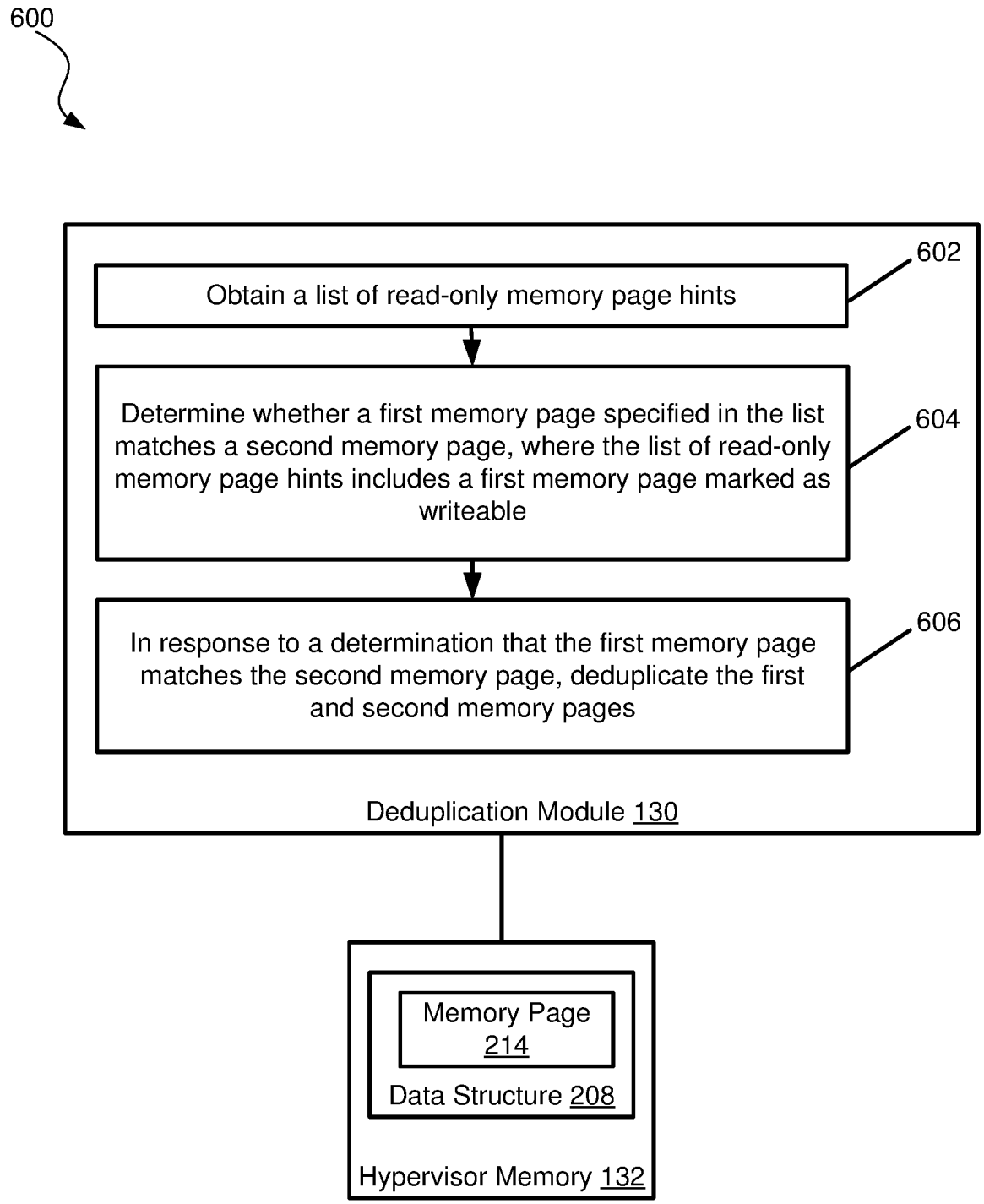
FIG. 6 is a diagram illustrating a method flow for initiating memory page deduplication, in accordance with various examples of the present disclosure.

FIG. 6 is a diagram illustrating a method flow 600 for initiating memory page deduplication, in accordance with various examples of the present disclosure. Method 600 is not meant to be limiting and may be used in other applications.

At action 602, the deduplication module 130 obtains a list of read-only memory page hints. At action 604, the deduplication module 130 determines whether a first memory page specified in the list matches a second memory page, where the list of read-only memory page hints includes a first memory page marked as writeable. At action 606, in response to a determination that the first memory page matches the second memory page, the deduplication module 130 deduplicates the first and second memory pages. The hypervisor memory 132 stores data structure 208 including the memory page 214, which in this example may be the second memory page.

It is understood that additional processes may be performed before, during, or after blocks 602-608 discussed above. It is also understood that one or more of the blocks of the method 600 described herein may be omitted, combined, or performed in a different sequence as desired.

Figure 7:
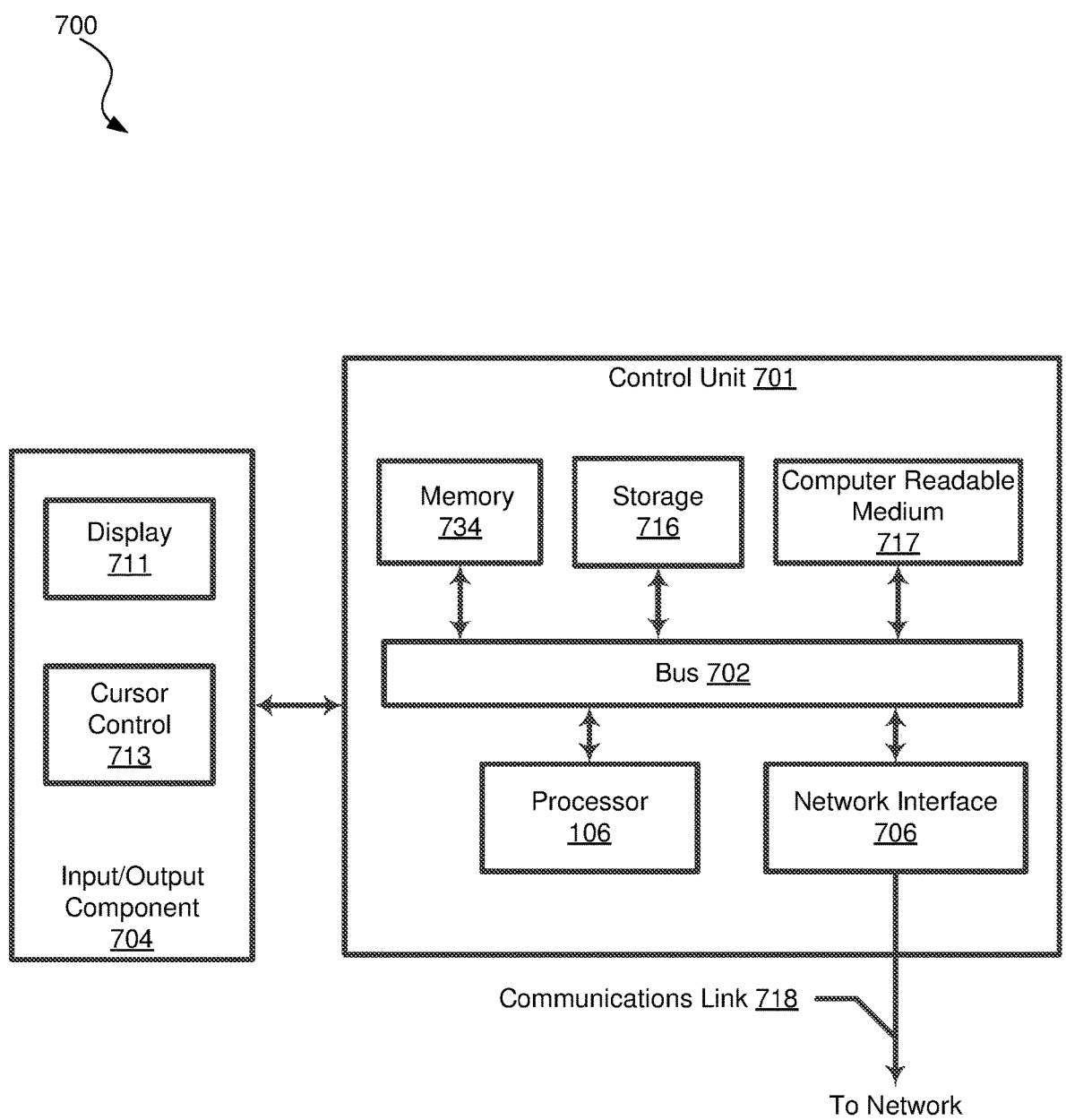
FIG. 7 is a block diagram of an electronic system suitable for implementing one or more examples of the present disclosure.

FIG. 7 is a block diagram of a computer system 700 suitable for implementing one or more examples of the present disclosure. In various implementations, computer system 700 corresponds to host machine 102, which may include a client or a server computing device. The client or server computing device may include a plurality of processors. The client or server computing device may additionally include one or more storage devices each selected from a group including floppy disk, flexible disk, hard disk, magnetic tape, any other magnetic medium, CD-ROM, any other optical medium, RAM, PROM, EPROM, FLASH-EPROM, any other memory chip or cartridge, and/or any other medium from which a processor or computer is adapted to read. The one or more storage devices may include stored information that may be made available to one or more computing devices and/or computer programs (e.g., clients) coupled to the client or server using a computer network (not shown). The computer network may be any type of network including a LAN, a WAN, an intranet, the Internet, a cloud, and/or any combination of networks thereof that is capable of interconnecting computing devices and/or computer programs in the system.

Computer system 700 includes a bus 702 or other communication mechanism for communicating information data, signals, and information between various components of computer system 700. Components include an input/output (I/O) component 704 that processes a user action, such as selecting keys from a keypad/keyboard, selecting one or more buttons or links, etc., and sends a corresponding signal to bus 702. In an example, a user may interact with a host computing system using I/O component 704 and cause virtual machine 116 to launch. In this example, the hypervisor may provide for de-duplication and share identical memory pages among the different processes and/or virtualized guests. I/O component 704 may also include an output component such as a display 711, and an input control such as a cursor control 713 (such as a keyboard, keypad, mouse, etc.).

A transceiver or network interface 706 transmits and receives signals between computer system 700 and other devices via a communications link 718 to a network. In an example, the transmission is wireless, although other transmission mediums and methods may also be suitable. The processor 106, which may be a micro-controller, digital signal processor (DSP), or other processing component, processes these various signals, such as for display on computer system 700 or transmission to other devices via communications link 718. The processor 106 may also control transmission of information, such as cookies or IP addresses, to other devices.

Components of computer system 700 also include a system memory component 734 (e.g., RAM), a static storage component 716 (e.g., ROM), and/or a disk drive 717. System memory component 734 may include memory 734. Computer system 700 performs specific operations by processor 106 and other components by executing one or more sequences of instructions contained in system memory component 734. Logic may be encoded in a computer readable medium, which may refer to any medium that participates in providing instructions to processor 106 for execution. Such a medium may take many forms, including but not limited to, non-volatile media, volatile media, and transmission media.

In various implementations, non-volatile media includes optical, or magnetic disks, or solid-state drives, volatile media includes dynamic memory, such as system memory component 734, and transmission media includes coaxial cables, copper wire, and fiber optics, including wires that include bus 702. In an example, the logic is encoded in non-transitory computer readable medium. In an example, transmission media may take the form of acoustic or light waves, such as those generated during radio wave, optical, and infrared data communications. Some common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EEPROM, FLASH-EEPROM, any other memory chip or cartridge, or any other medium from which a computer is adapted to read.

In various examples, execution of instruction sequences (e.g., method flow 300, method flow 400, method flow 500, and/or method flow 600) to practice the present disclosure may be performed by computer system 700. In various other examples, a plurality of computer systems 700 coupled by communication links 718 to the network (e.g., such as a LAN, WLAN, PTSN, and/or various other wired or wireless networks, including telecommunications, mobile, and cellular phone networks) may perform instruction sequences to practice the present disclosure in coordination with one another.

Where applicable, various examples provided by the present disclosure may be implemented using hardware, software, or combinations of hardware and software. Also where applicable, the various hardware components and/or software components set forth herein may be combined into composite components including software, hardware, and/or both without departing from the spirit of the present disclosure. Where applicable, the various hardware components and/or software components set forth herein may be separated into sub-components including software, hardware, or both without departing from the spirit of the present disclosure. In addition, where applicable, it is contemplated that software components may be implemented as hardware components, and vice-versa.

Application software in accordance with the present disclosure may be stored on one or more computer readable mediums. It is also contemplated that the application software identified herein may be implemented using one or more general purpose or specific purpose computers and/or computer systems, networked and/or otherwise. Where applicable, the ordering of various steps or actions described herein may be changed, combined into composite steps or composite actions, and/or separated into sub-steps or sub-actions to provide features described herein.

The foregoing disclosure is not intended to limit the present disclosure to the precise forms or particular fields of use disclosed. As such, it is contemplated that various alternate examples and/or modifications to the present disclosure, whether explicitly described or implied herein, are possible in light of the disclosure. Changes may be made in form and detail without departing from the scope of the present disclosure. Thus, the present disclosure is limited only by the claims.

What is claimed is:

1. A method of de-duplicating one or more memory pages comprising:
   determining, by a hypervisor, that a second memory page is a duplicate of a first memory page, the first memory page being on a list of read-only memory pages that a guest will not modify for a period of time, the list being received from the guest;
   in response to the determination that the second memory page is the duplicate of the first memory page, write protecting the first memory page;
   determining that the first memory page does not match the second memory page after write protecting the first memory page; and
   in response to the determination that the first memory page does not match the second memory page, reversing, by the hypervisor, the write protection applied on the first memory page.

2. The method of claim 1, further including:
   in response to the determination that the second memory page is the duplicate of the first memory page, write protecting the second memory page if the second memory page is not write protected.

3. The method of claim 2, further including:
   in response to the determination that the first memory page does not match the second memory page, reversing, by the hypervisor, the write protection applied on the second memory page if the second memory page is write protected.

4. The method of claim 1, further including:
   searching, by the hypervisor, a data structure for a duplicate of the first memory page, the data structure storing the second memory page.

5. The method of claim 4, further including:
   receiving, by the hypervisor, an indication that the second memory page will not be modified by the guest for a period of time.

6. The method of claim 5, further including:
   inserting, by the hypervisor, the second memory page into the data structure if the data structure does not store a duplicate of the second memory page.

7. A system for de-duplicating one or more memory pages comprising:
   a non-transitory memory; and
   one or more hardware processors coupled to the non-transitory memory and configured to read instructions from the non-transitory memory to cause the system to perform operations comprising:
   determining, by a hypervisor, that a second memory page is a duplicate of a first memory page, the first memory page being on a list of read-only memory pages that a guest will not modify for a period of time, the list being received from the guest;
   in response to the determination that the second memory page is the duplicate of the first memory page, write protecting the first memory page;
   determining that the first memory page does not match the second memory page after write protecting the first memory page; and
   in response to the determination that the first memory page does not match the second memory page, reversing, by the hypervisor, the write protection applied on the first memory page.

8. The system of claim 7, wherein the write protecting the first memory page includes indicating that the first memory page is read-only.

9. The system of claim 7, wherein the write protecting the first memory page includes indicating that the first memory page is readable-and-executable only.

10. The system of claim 7, further comprising:
    in response to the determination that the second memory page is the duplicate of the first memory page, determining whether the second memory page is write protected.

11. The system of claim 10, further comprising:
    in response to a determination that the second memory page is not write protected, write protecting the second memory page.

12. The system of claim 11, further comprising:
    in response to the determination that the first memory page does not match the second memory page, reversing the write protection applied on the second memory page.

13. The system of claim 7, further comprising:
    searching a data structure for a duplicate of the first memory page, wherein the data structure stores the second memory page.

14. The system of claim 13, further comprising:
    receiving an indication that the second memory page will not be modified by the guest for a period of time.

15. The system of claim 14, further comprising:
    inserting the second memory page into the data structure if the data structure does not store a duplicate of the second memory page.

16. A non-transitory machine-readable medium comprising a plurality of machine-readable instructions that when executed by one or more processors is adapted to cause the one or more processors to perform a method comprising:
    determining, by a hypervisor, that a second memory page is a duplicate of a first memory page, the first memory page being on a list of read-only memory pages provided that a guest will not modify for a period of time, the list being received from the guest;
    in response to the determination that the second memory page is the duplicate of the first memory page, write protecting the first memory page;
    determining that the first memory page does not match the second memory page after write protecting the first memory page; and
    in response to a determination that the first memory page does not match the second memory page, reversing, by the hypervisor, the write protection applied on the first memory page.

17. The non-transitory machine-readable medium of claim 16, the method further including:
    in response to the determination that the second memory page is the duplicate of the first memory page, write protecting the second memory page if the second memory page is not write protected.

18. The non-transitory machine-readable medium of claim 16, the method further including:
in response to the determination that the first memory page does not match the second memory page, reversing, by the hypervisor, the write protection applied on the second memory page if the second memory page is write protected.

19. The non-transitory machine-readable medium of claim 16, the method further including:
searching, by the hypervisor, a data structure for a duplicate of the first memory page, the data structure storing the second memory page;
receiving, by the hypervisor, an indication that the second memory page will not be modified by a guest for a period of time; and
inserting, by the hypervisor, the second memory page into the data structure if the data structure does not store a duplicate of the second memory page.

* * * * *